United States Patent [19]
Doyle

[11] Patent Number: 6,107,819
[45] Date of Patent: Aug. 22, 2000

[54] UNIVERSAL NON VOLATILE LOGIC GATE

[75] Inventor: James T. Doyle, Chandler, Ariz.

[73] Assignee: Intel Corporation, Santa Clara, Calif.

[21] Appl. No.: 08/884,961

[22] Filed: Jun. 30, 1997

[51] Int. Cl.[7] .............................. G06F 7/38; H03K 19/20
[52] U.S. Cl. .................... 326/37; 326/37; 326/38; 326/17; 326/104; 326/105; 326/49; 326/50; 326/87
[58] Field of Search ........................ 326/37, 105, 104, 326/38, 17, 41, 39, 108, 49, 50, 87

[56]  References Cited

U.S. PATENT DOCUMENTS

| | | | |
|---|---|---|---|
| 4,157,480 | 6/1979 | Edwards | 326/37 |
| 4,158,147 | 6/1979 | Edwards | 326/37 |
| 4,292,548 | 9/1981 | Suarez et al. | 326/37 |
| 4,399,377 | 8/1983 | Jones | 326/37 |
| 5,023,775 | 6/1991 | Poret . | |
| 5,134,311 | 7/1992 | Biber et al. | 307/270 |
| 5,144,582 | 9/1992 | Steele | 365/189.08 |
| 5,185,539 | 2/1993 | Snyder et al. | 326/37 |
| 5,235,221 | 8/1993 | Douglas et al. | 326/38 |
| 5,559,447 | 9/1996 | Rees | 326/30 |
| 5,661,418 | 8/1997 | Narayana et al. | 326/105 |
| 5,825,202 | 10/1998 | Tavana et al. | 326/39 |

*Primary Examiner*—Michael Tokar
*Assistant Examiner*—Vibol Tau
*Attorney, Agent, or Firm*—Blakely, Sokoloff, Taylor & Zafman, LLP

[57]  ABSTRACT

A programmable circuit is provided. The programmable circuit includes a programmable inverter circuit (PIC) that is configured to receive an input signal and to generate an output signal. The programmable circuit also includes a teaching circuit that is coupled to the PIC. The teaching circuit is configured to compare the output signal of the PIC to a desired output signal. Responsive to this comparison, the teaching circuit is configured to generate a control signal to the PIC. In response to the control signal the PIC is configured to generate the desired output signal.

28 Claims, 4 Drawing Sheets

UNIVERSAL NON VOLATILE LOGIC GATE

BACKGROUND OF THE INVENTION

(1) Field of the Invention

The present invention relates to the field of digital circuits. More specifically, the present invention relates to programmable logic circuits.

(2) Description of the Related Art

Programmable logic circuits may be implemented to perform various logic functions. Very often, the implementation of complex logic functions require a large number of logic gates. Typically, these logic gates include NAND and NOR logic gates when using CMOS technology. The use of NAND gates is preferable to the use of NOR gates, as NOR gates may consume a larger amount of power and require more voltage than NAND gates.

The use of programmable logic circuits for resolving various logic combinations may be disadvantageous as these circuits utilize logic elements that once programmed to achieve specific functions remain dedicated for the respective specific functions. Since dedicated elements, caused by programming, may not be changed to achieve other functions, once programmed, conventional programmable logic circuits are limited in the number of applications that may be implemented by way thereof. Such conventional logic circuits are also disadvantageous in that they need to be custom logic designed.

It is desirable to provide a "universal logic gate" (ULG) that may be trained to function in different logic ways. It is desirable to provide a ULG that alone or in conjunction with other such ULGs and/or other logic gates may be trained to provide almost any combinatorial logic function. It is also desirable to provide a method and apparatus for realizing various logic combinations with a minimum number of logic gates.

BRIEF SUMMARY OF THE INVENTION

The present invention provides a programmable circuit. The programmable circuit includes a programmable inverter circuit (PIC) that is configured to receive an input signal and to generate an output signal. The programmable circuit also includes a teaching circuit that is coupled to the PIC. The teaching circuit is configured to compare the output signal of the PIC to a desired output signal. Responsive to this comparison, the teaching circuit is configured to generate a control signal to the PIC. In response to the control signal the PIC is configured to generate the desired output signal.

BRIEF DESCRIPTION OF THE DRAWINGS

The features, aspects, and advantages of the present invention will become more fully apparent from the following detailed description, appended claims, and the accompanying drawings in which:

DETAILED DESCRIPTION OF THE INVENTION

In the following description, numerous specific details are set forth to provide a thorough understanding of the present invention. However, one of ordinary skill in the art will recognize that the invention may be practiced without these specific details. In some instances, well-known circuits, structures, and techniques are not shown in detail to avoid obscuring the present invention.

Figure 1:
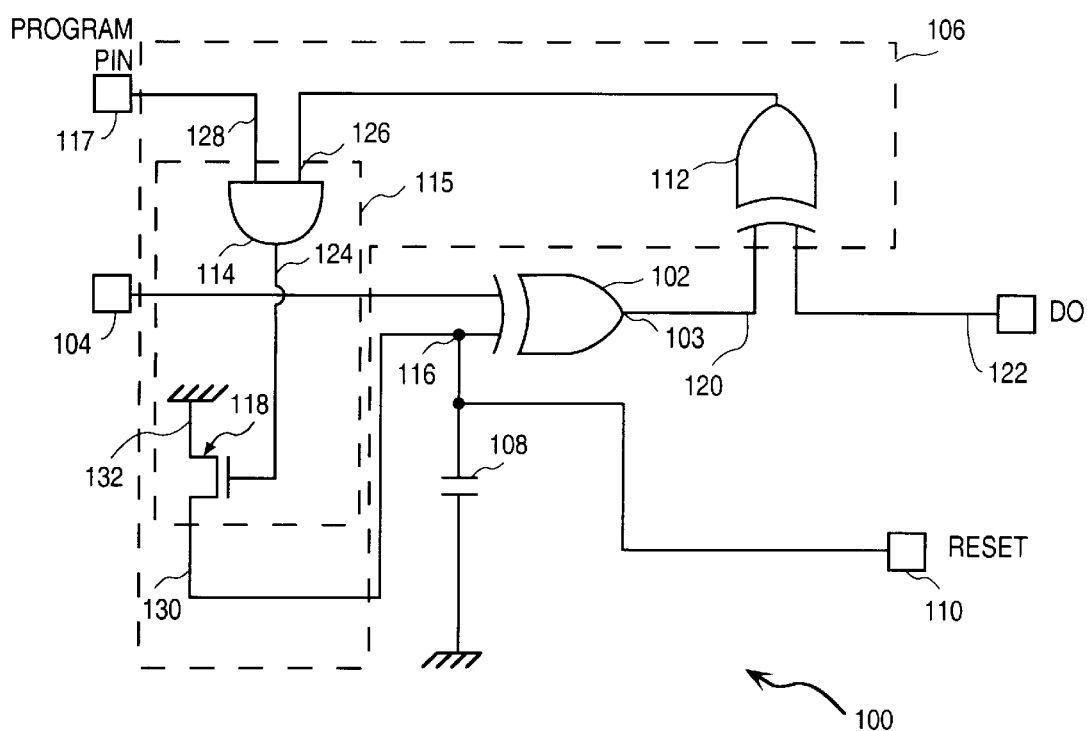
FIG. 1 illustrates a programmable circuit according to the present invention.

FIG. 1 illustrates a programmable circuit 100 according to the present invention. The programmable circuit 100 includes a programmable inverter circuit 102. In one embodiment according to the present invention, the programmable inverter circuit 102 is implemented as an XOR device, but the present invention is not limited in scope to this implementation. XOR device 102 has a first input 104 configured to receive an input signal. Furthermore, XOR device 102 has a second input 116 (hereinafter referred to as "control input"). The control input 116 is coupled to a storage device 108, which, in the particular embodiment described herein, is implemented as a capacitor, but the present invention is not limited in scope to a capacitor as a storage device.

Initially, when the programmable circuit 100 is reset, capacitor 108 is charged via reset pin 110 to a voltage level substantially equal to logic "1". Driving a logic 1 to control input 116 of XOR device 102 causes this device to operate as an inverter. Assume that the input signal driven to first input 104 of XOR 102 is logic 1. In this case, XOR device 102 outputs a "0" logic, the logic complement (inverse) of the logic 1 signal input to XOR device 102. Assume further that the input signal to the first input 104 of XOR gate device 102 is 0 logic. In this case, XOR gate 102 outputs a logic 1 signal, i.e., the logic complement (inverse) of the 0 logic signal input thereto. Accordingly, XOR device 102, with capacitor 108 charged to a "high" voltage (logic 1), operates as an inverter in its default state.

The programmable circuit 100 further includes a teaching circuit 106 (shown in dotted line). Teaching circuit 106 has an input coupled to output 103 of XOR device 102 and a second input that receives a DESIRED OUTPUT (DO) signal. The DO signal is set to a logic value (desired output) that the programmable inverter circuit 102 is expected to generate at its output. Depending on signal DO and on a signal generated at output 103 of programmable inverter 102 to teach circuit 106 "teaches" programmable inverter 102 to act as either an inverter or a buffer, to generate at output 103 thereof the DO signal.

Teaching circuit 106 includes a comparator circuit 112 that compares an output signal, generated at output 103 of programmable inverter 102, with the DO signal. In response to the comparison, comparator circuit 112 generates a signal which indicates whether the output of the programmable inverter 102 matches (has the same logic value as) DO. In one embodiment according to the present invention, comparator circuit 112 includes an XOR gate but the present invention is not limited in scope to this implementation. If the output signal generated by programmable inverter 102 matches DO, the programmable inverter 102 remains in the same state performing the same logic function (i.e., acts as an inverter). However, if the DO logic value is different from the logic value at the output 103 of programmable inverter 102, circuit 112 causes programmable inverter 102 to change state. Since the default state of programmable inverter 102 is "inverter", the state of programmable inverter 102 is changed to act as a buffer.

Comparator circuit 112 is coupled to a programming circuit 115 (shown in dotted line) which includes program enable circuit 114 and a switch circuit 118. In one embodiment according to the present invention described herein, program enable circuit 114 is implemented as an AND gate, but the present invention is not limited in scope to this implementation. When comparator circuit 112 determines whether DO matches or not the signal generated at output 103 of programmable inverter 102, comparator circuit 112 generates a signal to program enable circuit 114 indicating the result of the comparison. If DO does not match the output of programmable inverter 102, comparator circuit 112 asserts a signal (logic 1) to program enable circuit 114. The logic 1 signal asserted by comparator 112 causes program enable circuit 114 to bias switch circuit 118 to discharge capacitor 108 to ground if program pin 117 is asserted. Switch circuit 118, which is implemented, in a non-limiting way, by a NMOS transistor, has a drain thereof coupled to capacitor 108, a source thereof coupled to ground and a gate thereof coupled to an output of AND gate 114. When AND gate 114 generates a logic 1 at its output, it drives this signal to the gate of transistor 118. A logic 1 signal asserted to the gate of transistor 118 causes transistor 118 to turn on thereby pulling node 116 to ground.

Assume initially, the input signal to programmable inverter 102 is at logic 1. Since programmable inverter 102, in its default state, acts as an inverter, the output thereof is set to logic 0 as a result of a logic 1 signal input thereof. If the desired output DO is 0, comparator circuit 112 generates at its output a 0 logic signal. A 0 logic signal disables programming of programmable inverter 102 as program enable circuit (AND gate 114) outputs a 0 logic signal to the gate of switch circuit 118 (NMOS transistor 118). A logic 0 at the gate of NMOS transistor 118 causes this transistor to be in cut-off, thereby preventing the discharge of capacitor 108 to ground via transistor 118. In this case, the control input 116 of programmable inverter 102 remains set to logic 1 by capacitor 108. Consequently, programmable inverter 102 remains in its default condition, i.e., it operates as an inverter.

However, if DO is at logic level 1 and the output 103 is set to logic 0, comparator circuit 112 outputs a logic 1 signal to AND gate 114. Assume that program pin 117, coupled to AND gate 114, is set to 1. AND gate 114 biases NMOS transistor 118 thereby causing this transistor to discharge capacitor 108 to ground thereby setting control input 106 of programmable inverter 102 to 0 logic. The input signal (logic 1) driven to first input 104 of programmable inverter 102 output causes programmable inverter 102 to output a logic 1 signal (the desired output). In this way, programmable inverter 102 is programmed to act as a buffer, being "taught" to act so by teaching circuit 106. Note that control (input 116) and programmability (output of AND gate 114) of programmable circuit 100 do not interfere with the input signal path to first input 104 making programmable circuit 100 very suitable for high speed circuits.

Figure 2:
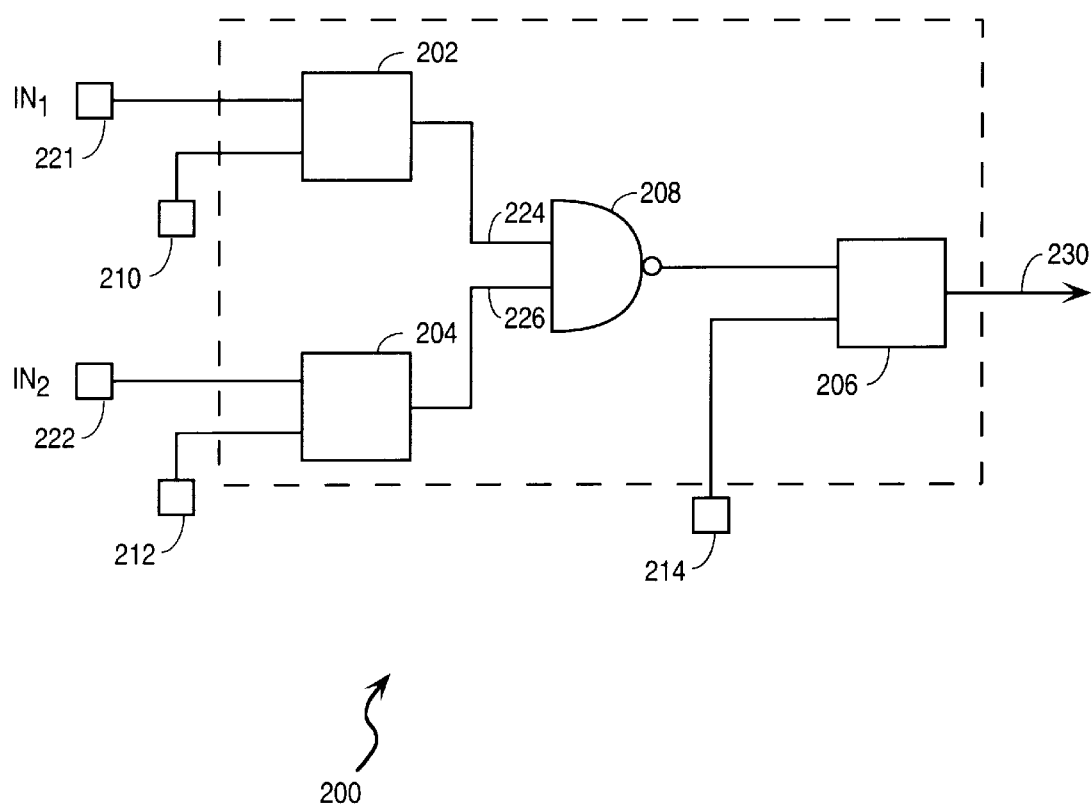
FIG. 2 illustrates a universal programmable gate according to the present invention.

FIG. 2 illustrates universal programmable gate (UPG) 200 according to the present invention. UPG 200 includes three programmable circuits 202, 204 and 206, each being substantially similar to programmable circuit 100 described in connection with FIG. 1. UPG 200 has inputs, $IN_1$ and $IN_2$, and three programming inputs, 210, 212 and 214 corresponding to the programming inputs of programmable circuits 202, 204 and 206. Each of the programmable circuits 202, 204 and 206 can be programmed to function either as a buffer or as an inverter. UPG 200 also includes a NAND gate 208 that has first and second inputs coupled to the outputs of programmable circuits 202 and 204 respectively. An output of NAND gate 208 is coupled to an input of programmable circuit 206.

UPG 200 may be trained to generate, with a reduced number of components, about any combinatorial logic realization of first and second inputs $IN_1$ and $IN_2$. For example, if both programmable circuits 202 and 204 are programmed to function as buffers, first and second inputs $IN_1$ and $IN_2$ are driven to NAND gate 208 which generates logic combination $\overline{IN_1 \cdot IN_2} = \overline{IN_1} + \overline{IN_2}$. Furthermore, depending on the state of programmable circuit 206, signal $\overline{IN_1 \cdot IN_2}$ may either be passed with no change through programmable circuit 206, in which case programmable circuit 206 functions as a buffer, or it may be inverted by programmable circuit 206 if this circuit is programmed to function as an inverter. In the later case ULG 200 outputs signal $IN_1 \cdot IN_2$ thus acting as an AND gate.

Assume programmable circuits 202 and 204 are programmed to work as inverters generating terms $\overline{IN_1}$ and $\overline{IN_2}$ respectively. NAND gate 508 receives these terms and in response generates term $IN_1 + IN_2$. This term is further passed through programmable circuit 206 if this circuit is programmed to function as a buffer. In this case, ULG 200 provides the logic function of an OR gate. Assume circuit 202 is programmed as an inverter and circuit 204 is programmed as a buffer. NAND gate 208 receives signals $\overline{IN_1}+$ and $IN_2$ and in response outputs signal $IN_1 + \overline{IN_2}$. This signal may be passed through programmable gate 206 unchanged or may be inverted to generate signal $\overline{IN_1} + IN_2$. The universal logic gate 200 may generate a plurality of logic terms that are logic combinations of $IN_1$ and $IN_2$ thereby providing the capability to realize, alone or in combination with other such ULG(s) any pattern of ones and zeros. ULGs may be utilized to realize digital building blocks such as decoders or Programmable Logic Arrays (PLA).

Figure 3:
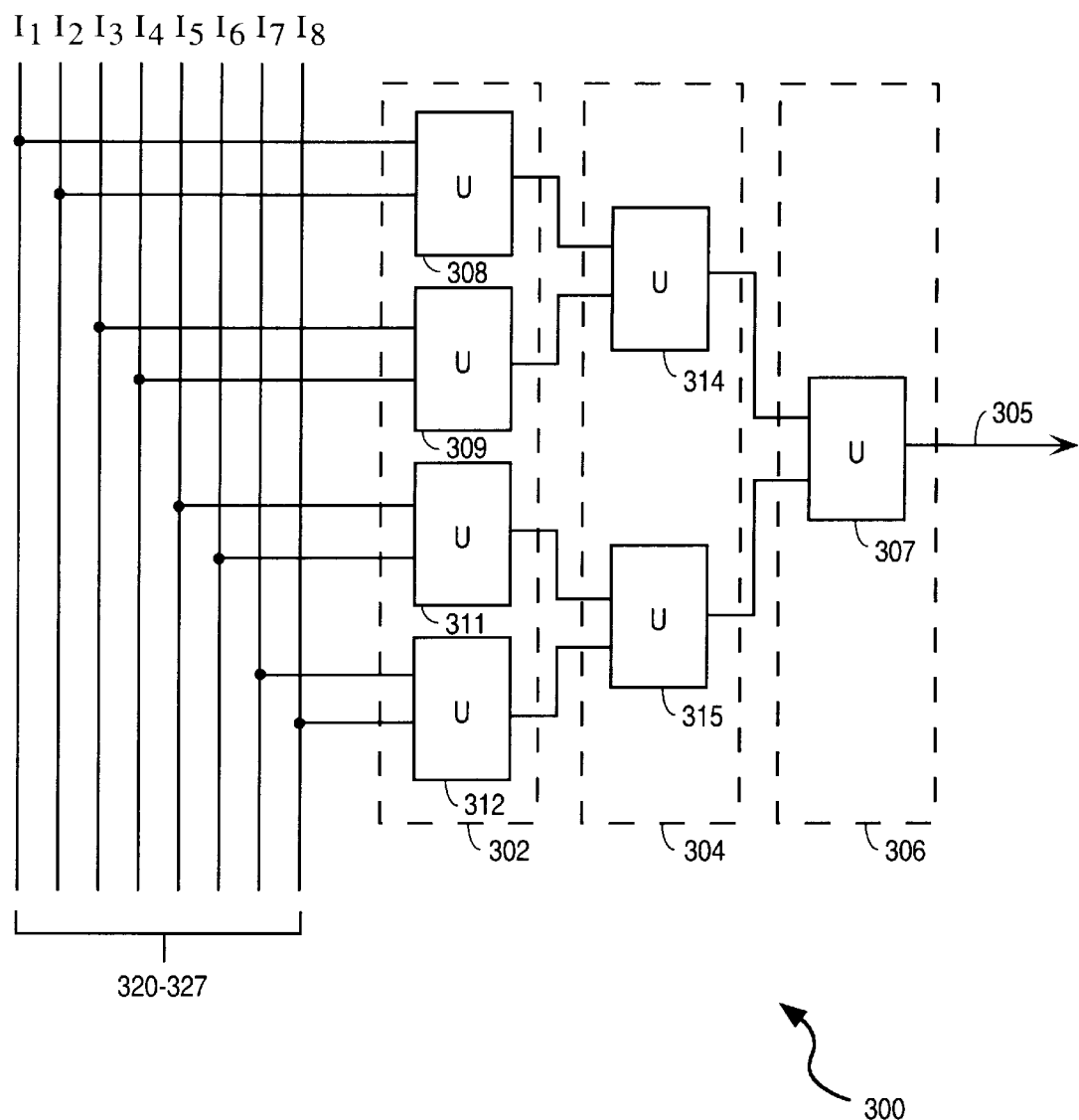
FIG. 3 illustrates a general purpose decoder circuit according to the present invention.

FIG. 3 illustrates a general purpose decoder circuit according to the present invention. In one embodiment according to the present invention described herein the decoder circuit is an eight input decoder. The decoder circuit includes eight separate levels of first, second and third stages 302, 304 and 306 (only stages 302, 304, and 306 of first level are shown in the figure) such that an 8-digit binary signal is generated at an output 305 of the decoder. Each decoder stage of a level includes at least one universal logic gate. Eight input signals may be input via eight lines 320–327 to first stage 302. In the embodiment described herein the first stage 302 includes four universal logic gates 308, 309, 311, and 312, but the present invention is not limited in scope to this configuration.

Each universal logic gate has an input, coupled to at least one subset of the 8 binary digits. In the embodiment of the present invention described herein the subset of 8 binary digits includes one digit. Also in the embodiment of the present invention described herein, each ULG has two inputs and is configured to be substantially similar with the ULG described in connection with FIG. 2, but the present invention is not limited to ULGs that have only two inputs. ULGs may be configured, based on a substantially same principle as the ULG of FIG. 2, to have more than two inputs and thus to generate a logical combination of more than two inputs. Each input of each universal gate (308, 309, 311, 312) of the first stage 302 receives a distinct binary digit of the group of 8 binary digits to be decoded. Each universal logic gate of first stage 302 also includes an output that is coupled to second stage 304. In the particular embodiment described herein the second stage 304 includes two universal logic gates 314 and 315. Each of the universal gates 314 and 315 has two inputs that are coupled to the outputs of two preceding universal logic gates. The first stage 302 operates to produce a plurality of minterms to the inputs of universal logic gates 314 and 315. ULG 314 receives combinations of $IN_1$, $IN_2$, $IN_3$ and $IN_4$ while ULG 315 receives combinations of $IN_5$, $IN_6$, $IN_7$ and $IN_8$. The third stage 306 includes one universal logic gate 307 that has two inputs. Each input is coupled to an output of one of the universal logic gates of the second stage 304. The universal logic gate 307 of third stage 306 outputs one binary digit of an eight- bit logic signal which represents a decoded binary digit.

The remaining seven levels of the eight levels of first, second and third stages, similar to stages 302, 304 and 306, are configured to combine in different ways to the 8 inputs $I_1$–$I_8$ to generate an output bit as a result of the combinations such that the eight levels operate as a decoder. Such logic combinations of inputs to decode an input logic signal such as $I_1$–$I_8$ are known to persons skilled in the art. Each of the 8 levels has an output that generates one bit of the eight bit logic signal that represents the output of the decoder.

The decoder 300 according to the present invention has several advantages over a conventional decoder. One of these advantages is that each of the universal logic gates of the decoder displays equal propagation time delay. Also, decoder 300 may require less gates than a conventional decoder. For example, for an 8-input decoder according to the present invention, a total of 56 universal logic gates may be required as the decoder circuit according to the present invention includes 8 levels of stages 302, 304, and 306. A conventional decoder may require more gates. Also, conventional decoder circuits require, for each input, two busses, one bus for an input digit and another bus for an input digit.

Figure 4:
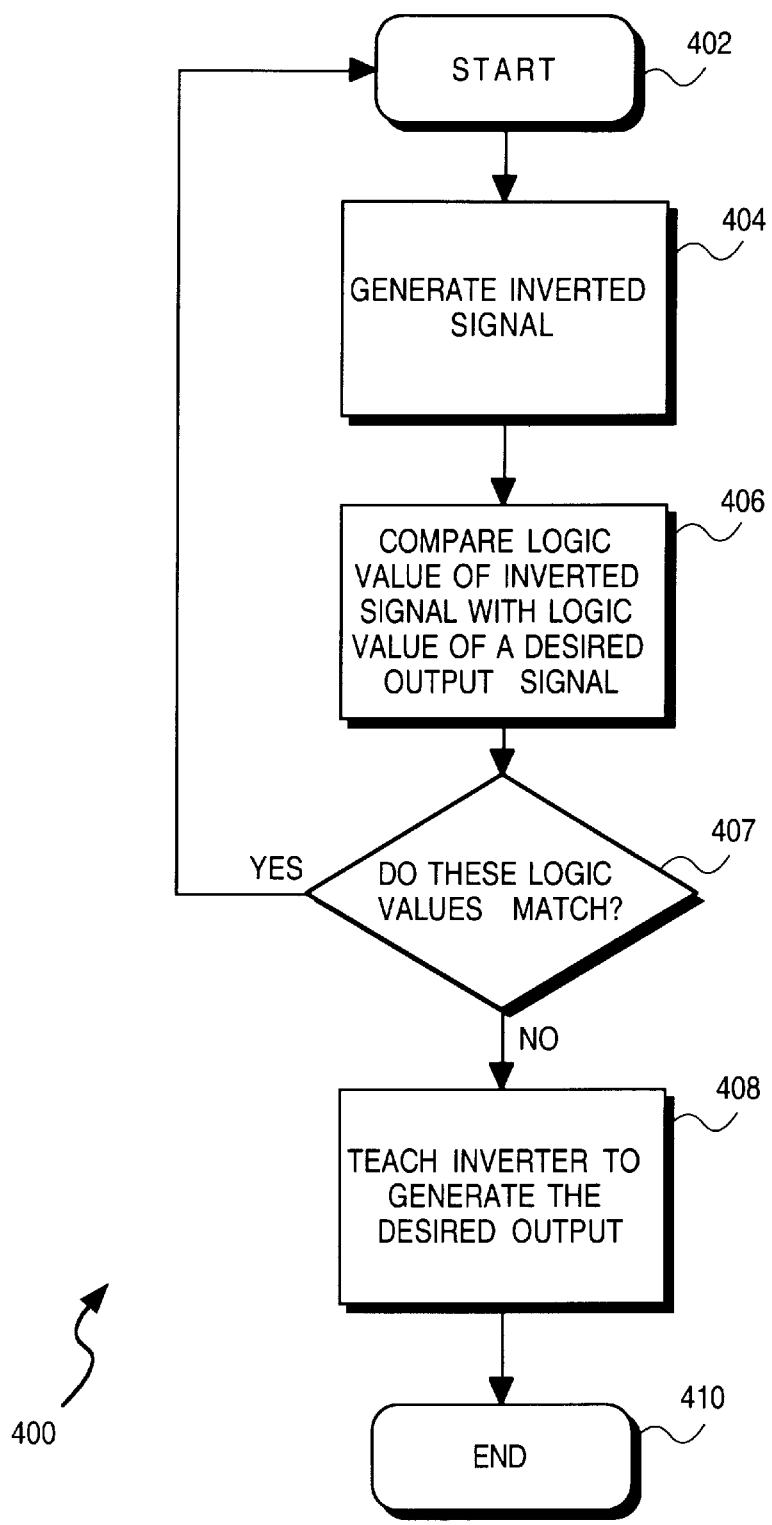
FIG. 4 illustrates a flow chart diagram for an embodiment of a process for training a programmable inverter circuit according to the present invention.

FIG. 4 illustrates a flow chart diagram for an embodiment of a process for training a programmable inverter circuit according to the present invention. The process starts at block 402 from where it flows to block 404. At block 404 an inverted signal is generated by a programmable circuit that is substantially similar with the one discussed in connection with FIG. 1. The programmable circuit includes a programmable inverter designed such that by default the programmable inverter functions as an inverter. The process then passes to block 406 where a logic value of the inverted signal is compared with a logic value of a desired output signal. The process further passes to block 407 where it is determined whether the logic value of the inverted signal and the logic value of the desired output match. If the logic value of the inverted signal is different from the logic value of the desired output, the process flows to block 408 where the programmable inverter is taught to generate the desired output signal. In one particular non-limiting embodiment according to the present invention, explained in connection with FIG. 1, the teaching of the inverter to generate the desired output signal may be performed by changing the logic value of a control input to the programmable inverter. However, if at block 407 it is determined that the output of the programmable inverter and the desired output match, the functionality of the programmable inverter remains the same and the process flows to block 402.

In the foregoing specification, the invention has been described with reference to specific embodiments thereof. It will however be evident that various modifications and changes can be made thereto without departing from the broad spirit and scope of the invention as set forth in the appended claims. The specification and drawings are, accordingly, to be regarded in an illustrative rather than a restrictive sense. Therefore, the scope of the invention should be limited only by the appended claims.

What is claimed is:

1. A programmable circuit, comprising:
 a programmable inverter circuit (PIC) configured to receive an input signal and to generate an output signal; and
 a teaching circuit, coupled to the PIC, configured to compare the output signal of the PIC to a desired output signal and responsive thereto to generate a control signal to the PIC responsive to which the PIC is configured to generate the desired output signal,
 wherein the teaching circuit includes a programming circuit, coupled to the comparator circuit, configured to generate the control signal.

2. The circuit of claim 1 wherein the teaching circuit includes a comparator circuit configured to receive the output and desired output signals.

3. The circuit of claim 1 wherein the programming circuit includes a switch device configured to switchably couple a first voltage level to the control signal.

4. The circuit of claim 3 further including a storage device configured to couple a second voltage level to the control signal.

5. A programmable circuit, comprising:
 a programmable inverter circuit (PIC) configured to receive an input signal and to generate an output signal; and
 a teaching circuit, coupled to the PIC, configured to compare the output signal of the PIC to a desired output signal and responsive thereto to generate a control signal to the PIC responsive to which the PIC is configured to generate the desired output signal,
 wherein the PIC is configured to act as one of an inverter circuit and a buffer circuit depending on the control signal.

6. A logic gate, comprising:
 first reusable programmable inverter having an input and an output;
 second reusable programmable inverter having an input and an output;
 a NAND gate having first and second inputs and an output, the first and second inputs coupled to the outputs of the first and second reusable programmable inverters; and
 a third reusable programmable inverter having an input coupled to the output off the NAND gate,
 wherein each of the first, second and third programmable inverters includes,
  a programmable inverter circuit (PIC) configured to receive an input signal and to generate an output signal, and
  a teaching circuit, coupled to the PIC, configured to compare the output signal of the PIC to a desired output signal and responsive thereto to generate a control signal to the PIC responsive to which the PIC is configured to generate the desired output signal.

7. The logic gate of claim 6 wherein the teaching circuit includes a comparator circuit configured to receive the output and desired output signals.

8. The logic gate of claim 7 wherein the teaching circuit includes a programming circuit, coupled to the comparator circuit, configured to generate the control signal.

9. The logic gate of claim 8 wherein the programming circuit includes a switch device configured to switchably couple a first voltage level to the control signal.

10. The logic gate of claim 9 further including a device configured to couple a second voltage level to the control signal.

11. A decoder circuit for decoding a group of N binary digits, the decoder circuit comprising:
 a first stage including at least one universal logic gate (ULG), the ULG having an input coupled to at least one subset of the N binary digits, the first stage having an output, the at least one subset having at least one digit, wherein the at least one ULG includes a first programmable inverter having an input and an output, the first programmable inverter having a programmable inverter circuit (PIC) coupled to a teaching circuit, the PIC having at least a first output signal and a second output signal, the teaching circuit having a first logic circuit that compares the first output signal of the PIC to a predetermined desired output signal and a second logic circuit that generates a control signal to an input of the PIC, wherein the control signal is a result of a process that includes responding to the first logic circuit, and wherein the second output signal of the PIC is a result of a process that includes responding to the control signal of the teaching circuit.

12. The decoder circuit of claim 11, further comprising:

a second stage including at least one ULG, the at least one ULG of the second stage having an input coupled to at least one subset of the output of the at least one ULG of the first stage, the second stage having an output; and a third stage including at least one ULG, the at least one ULG of the third stage having an input coupled to at least one subset of the output of the at least one ULG of the second stage.

13. The decoder circuit of claim 12 wherein the ULG further includes a second programmable inverter having an input and an output.

14. The decoder circuit of claim 13 wherein the ULG further includes a NAND gate having first and second inputs and an output, the first and second inputs coupled to the outputs of the first and second programmable inverters.

15. The decoder circuit of claim 14 wherein the ULG further includes a third programmable inverter having an input coupled to the output of the NAND gate.

16. The decoder circuit of claim 11 wherein the first stage includes four ULGs.

17. The decoder circuit of claim 16 wherein the second stage includes two ULGs coupled to the four ULGs of the first stage.

18. The decoder circuit of claim 17 wherein the third stage includes one ULG coupled to the two ULGs of the second stage.

19. A method for teaching a circuit to generate a desired output signal, the method comprising:

a. causing the circuit to generate an inverted signal;

b. comparing a logic value of the inverted signal with a logic value of a desired output signal; and c. teaching the circuit to generate the desired output signal, if the logic value of the inverted signal is substantially different from the desired output.

20. The method of claim 19 wherein teaching the circuit to generate the desired output signal includes providing a result of the comparing step to the circuit.

21. A method for providing one of a buffer circuit and inverter circuit, the method comprising:

providing a programmable inverter;

coupling a comparator to an output of the inverter;

coupling an output of the comparator to a programming circuit; and coupling an output of the programming circuit to the programmable inverter.

22. A logic gate, comprising:

first programmable inverter having an input and an output;

second programmable inverter having an input and an output;

a NAND gate having first and second inputs and an output, the first and second inputs coupled to the outputs of the first and second programmable inverters;

a third programmable inverter having an input coupled to the output of the NAND gate; and each of the first, second and third programmable inverters includes a programmable inverter circuit (PIC) configured to receive an input signal and to generate an output signal, and a teaching circuit, coupled to the PIC, configured to compare the output signal of the PIC to a desired output signal and responsive thereto to generate a control signal to the PIC responsive to which the PIC is configured to generate the desired output signal.

23. The logic gate of claim 22, wherein the teaching circuit includes a comparator circuit configured to receive the output and desired output signals.

24. The logic gate of claim 23, wherein the teaching circuit includes a programming circuit, coupled to the comparator circuit, configured to generate the control signal.

25. The logic gate of claim 24, wherein the programming circuit includes a switch device configured to switchably couple a first voltage level to the control signal.

26. The logic gate of claim 25, further comprising:

a device configured to couple a second voltage level to the control signal.

27. The circuit of claim 5 wherein the teaching circuit includes a comparator circuit configured to receive the output and desired output signals.

28. The circuit of claim 27 wherein the teaching circuit includes a programming circuit, coupled to the comparator circuit, configured to generate the control signal.

* * * * *